United States Patent [19]
Kim

[11] Patent Number: 5,844,280
[45] Date of Patent: Dec. 1, 1998

[54] DEVICE FOR PROTECTING A SEMICONDUCTOR CIRCUIT

[75] Inventor: Dae-Kyu Kim, Kyungki-do, Rep. of Korea

[73] Assignee: Samsung Electronics, Co., Ltd., Suwon, Rep. of Korea

[21] Appl. No.: 774,618

[22] Filed: Dec. 30, 1996

[30] Foreign Application Priority Data

Dec. 30, 1995 [KR] Rep. of Korea ................ 1995/68225

[51] Int. Cl.⁶ ................................................ H01L 23/62
[52] U.S. Cl. ......................... 257/355; 257/370; 257/378
[58] Field of Search .................................. 257/355, 356, 257/360, 361, 376, 370, 371

[56] References Cited

U.S. PATENT DOCUMENTS 5,525,826  6/1996  Palara ..................................... 257/378
5,629,545  5/1997  Leach ..................................... 257/378

*Primary Examiner*—David B. Hardy
*Attorney, Agent, or Firm*—Marger, Johnson, McCollom, P.C.

[57] ABSTRACT

A protection device for protecting a semiconductor circuit from positive and negative overvoltage such as static electrical discharges. A p-type substrate is provided having a pair of spaced apart n-type regions formed therein. Each of the spaced apart n-type regions has a p⁺ region and an n⁺ region formed therein. Each of the spaced apart n-type regions also includes an n⁺ drain tap which has a portion in contact with the substrate. The n⁺ region and one p⁺ region of one of the spaced apart n-type regions are connected to a terminal of a semiconductor circuit. The n⁺ region and p⁺ regions of the other n-type region are connected to a power voltage of the semiconductor device. A insulated gate is formed on a p-type semiconductor substrate, and is in contact with both n+ drain taps. The gate is grounded. The bilateral protection device of the present invention protects the semiconductor circuit against positive and negative overvoltages.

12 Claims, 2 Drawing Sheets

DEVICE FOR PROTECTING A SEMICONDUCTOR CIRCUIT

BACKGROUND OF THE INVENTION

A. Field of the Invention

The present invention relates to a device for protecting a semiconductor circuit, and more particularly, to a bilateral protection device for protecting a semiconductor circuit from both positive and negative overvoltages.

B. Description of the Prior Art

Semiconductor devices often include an input/output protection circuit to protect internal circuits of the semiconductor device against high voltages, such as an electrostatic discharge (ESD), which might be inadvertently applied to an input terminal or an output terminal of the internal circuits. Known protection devices employ a diode, a resistor or a transistor to protect the semiconductor internal circuits. More recently, a thyristor or a silicon controlled rectifier (SCR) have also been used in protection devices.

FIG. 1 is a cross-sectional schematic view illustrating a conventional electrostatic protection device which includes a silicon controlled rectifier (SCR). An n region 2 is formed in a p-type substrate 1. A $p^+$ region 3 and an adjacent $n^+$ region 4 are formed in the n region 2. A second $n^+$ region 5 is formed in the substrate 1. Region 5 is spaced apart from the n-type region 2. The junction depth of region 5 is shallower than that of n region 2, and similar to the junction depth of the $p^+$ region 3 and the $n^+$ region 4. An oxide film 10 is formed between the $p^+$ region 3 and the first $n^+$ region 4. A parasitic pnp transistor is formed wherein region 3 is the emitter, region 2 is the base, and substrate 1 is the collector. The $p^+$ region 3 and the $n^+$ region 4 are connected to an input/output terminal PAD of the semiconductor device, and together are designated as the anode. The $n^+$ region 5 is connected to ground, Vss, and is designated as the cathode.

When a large positive voltage is applied to the terminal PAD, a breakthrough occurs in the parasitic pnp transistor whereby current is discharged to ground through the cathode. The SCR has an advantage in that a large amount of current can be discharged even through a small area of the whole SCR. However, the breakthrough voltage of the parasitic pnp transistor (i.e. the trigger voltage of the SCR) is very high, typically between 40 and 70 V. However, the internal circuits of the semiconductor device could be damaged by an ESD of less than 40 volts, leaving them unprotected.

The breakthrough voltage of the parasitic pnp transistor could be lowered by increasing the dopant density of either substrate 1 and n region 2. A low voltage trigger SCR (LVTSCR) and a modified lateral SCR (MLSCR) have been proposed which incorporate increased dopant densities to lower the trigger voltage.

FIG. 2 is a cross-sectional schematic view illustrating a conventional low voltage trigger SCR (LVTSCR). In an SCR-protection device as shown in FIG. 1, an $n^+$ drain-tap 6 is formed at the interface of the substrate 1 and the n region 2. The junction depth of drain-tap 6 is similar to that of the second $n^+$ region 5. A thick oxide film 10 is formed between the drain-tap 6 and the $p^+$ region 3. An insulating gate 20, having a thin gate insulator 22 and a gate electrode 24 is formed over substrate 1 and bridges the drain-tap 6 and the second $n^+$ region 5. Gate 20 and the $n^+$ region 5 are connected to ground. The MLSCR differs from the LVSCR in that instead of a gate, an oxide film is deposited over the substrate and bridging n+ regions 5 and 6.

When an overvoltage is applied to the PAD, a breakdown first occurs between the substrate 1 and the drain-tap 6 before the breakdown occurs between the substrate 1 and the n region 2 since the drain-tap 6 has high density of $n^+$ type. Furthermore, the trigger voltage is very low because the MLSCR has a Metal-Oxide-Semiconductor (MOS) transistor having the drain-tap 6 and the second $n^+$ region 5 as a source and a drain, respectively. The trigger voltage of an LVTSCR is very low, typically 10–15 V.

When a positive voltage lower than the trigger voltage of the LVTSCR is applied to the terminal PAD, a small current flows between the anode and the cathode. When a positive voltage higher than the trigger voltage of the LVTSCR is applied to the terminal PAD, the parasitic vertical pnp transistor turns ON, and overcurrent is discharged to ground, thereby protecting the internal circuits. When the breakthrough occurs between the drain-tap 6 and the cathode, the temperature of drain-tap 6 increases. However, the relatively high-temperature drain tap 6 is bypassed under high-voltage conditions since the current is also discharged through a large junction surface of the parasitic horizontal npn transistor, and the vertical pnp transistor. Accordingly, the LSTSCR has an excellent protection characteristic against a positive ESD.

If a relatively small negative ESD is applied to the terminal PAD, an electron is ejected from the n region 2 to the substrate 1, providing a current flow when weak negative voltage is applied to the terminal PAD. If a large negative ESD is applied to the terminal PAD, the horizontal parasitic transistor comprised of n region 2 (emitter), the substrate 1 (base) and the second n+ region 5 (collector), turns on, providing a current discharge path. However, the temperature of the cathode, that is, the second n+ region 5 and the circumference thereof, is raised since the junction depth of the second n+ region 5 is shallow. If the high current flow raises the temperature of the cathode sufficiently, the metal electrode will open or short circuit, thereby damaging the device. Accordingly, a conventional LVTSCR or MLSCR does not provide adequate protection against a large negative voltage applied to the terminal PAD.

SUMMARY OF THE INVENTION

Accordingly, the object of the present invention is to provide a device for protecting the internal circuits of a semiconductor device which can efficiently discharge current resulting from either a positive or negative overvoltage, thereby overcoming the limitations and disadvantages of the prior art.

A device according to the present invention is embodied in a device for protecting a semiconductor circuit which includes a p-type semiconductor substrate and first and second spaced apart n-type regions formed in the substrate. Each n-type region formed in the substrate includes a p+ type and a first n+ type region formed therein. Each n-type region also includes an n+ type drain tap formed therein which has a portion in the substrate adjacent the n-type region. The drain taps are formed to have a higher dopant density than the n+ type regions formed in the n-type regions. A gate is formed on the substrate to form a MOS transistor having n+ type drain tabs as a source and a drain. The region and the n+ type region formed in one n-type region are connected to a terminal PAD of the semiconductor device. The p+ and n+ type of the other n-type region are connected to a power voltage terminal or to a ground, deignated as Vss of the semiconductor device. The gate is connected to the ground.

The device for protecting a semiconductor circuit in accordance with the invention protects a semiconductor device from both positive and negative overvoltages.

Additional objects and advantages of the invention are set forth in the detailed description which follows.

DESCRIPTION OF THE PREFERRED EMBODIMENT

Figure 1:
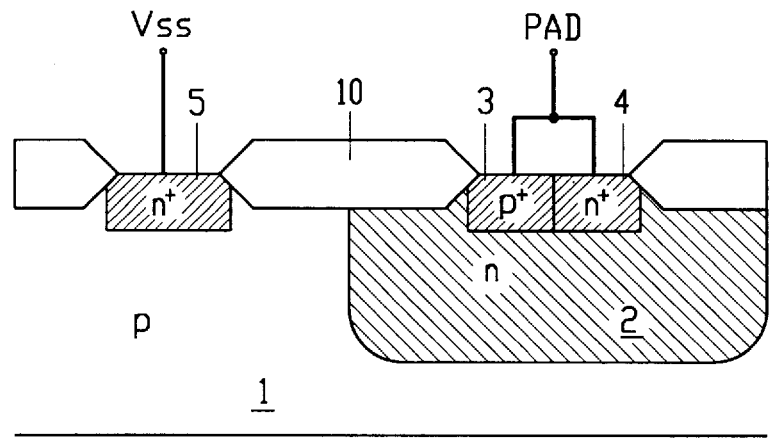
FIG. 1 is a cross-sectional schematic view of a conventional electrostatic protection silicon controlled rectifier (SCR)
Figure 2:
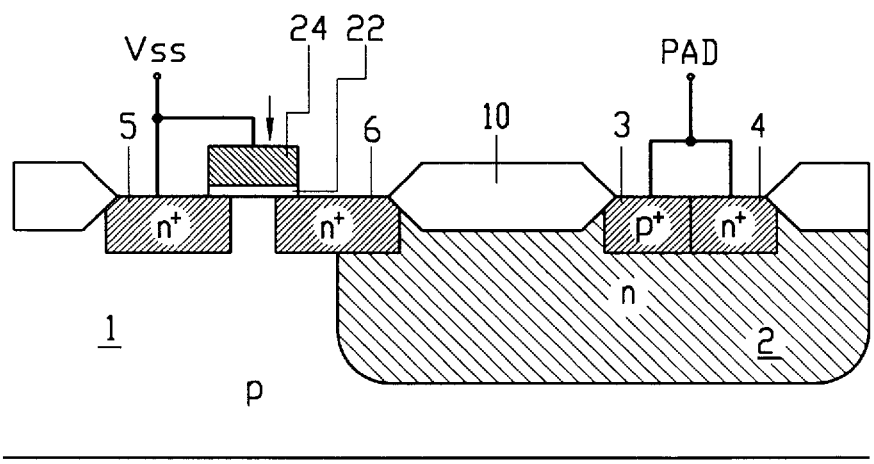
FIG. 2 is a cross-sectional schematic view of a conventional low voltage trigger SCR (LVTSCR)
Figure 3:
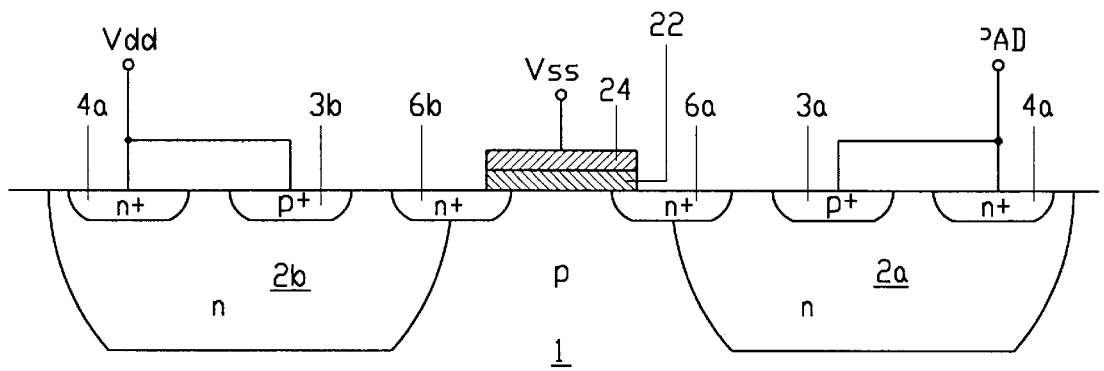
FIG. 3 is a cross-sectional schematic view of an electrostatic protection device in accordance with a preferred embodiment of the present invention.

An electrostatic protection device in accordance with a preferred embodiment of the present invention is shown generally in FIG. 3. Two n-type regions 2a and 2b are formed in a p-type substrate 1. Regions 2a and 2b are spaced apart by a distance sufficient to provide room on substrate 1 for n+ regions 6a and 6b, and gate 20 as described in more detail below. In the embodiment shown, regions 2a and 2b are formed with a similar depth, although the invention is not limited to that configuration.

A p+ region 3a and an n+ region 4a are formed in region 2a. A p+ region 3b and an n+ region 4b are formed in region 2b. In the embodiment illustrated, regions 3a and 4a are spaced apart, as are regions 3b and 4b, although the invention is not limited in that regard. An n+ drain tap 6a is formed which overlaps and contacts both region 2a and substrate 1. A second n+ drain tap 6b is formed which overlaps the boundary between region 2b and substrate 1. n+ drain taps 6a aand 6b are formed near a center of substrate 1. Regions 2a, 2b, 3a, 3b, 4a, 4b, 6a and 6b are symmetrically spaced apart from the center.

Those skilled in the art will appreciate that a pair of vertical pnp transistors Tr.1 and Tr.2 are thus provided with respective regions 3a and 3b serving as emitters, regions 2a and 2b serving as bases, and the substrate 1 serving as a collector for each. In addition, a horizontal npn transistor Tr.3 is formed having the n region 2b as the emitter, the substrate 1 as the base, and the n region 2a as the collector.

In the embodiment shown, a gate 20 is formed on substrate 1 to form a MOS transistor having regions 6a and 6b as a source and a drain. Gate 20 includes a conductive layer 24 and a thin insulating layer 22 although the invention is not limited to that configuration.

Regions 3a and 4a are connected to an input/output terminal PAD of the semiconductor circuit which is to be protected. Regions 3b and 4b are connected to a first voltage terminal referring to either a power voltage lead (Vdd) or a ground(Vss) of the semiconductor circuit. Gate 20 is connected to a second voltage terminal referring to the ground. The operation of a protection device according to the present invention will now be described. In this description, regions 3b and 4b are connected to the Vdd. When a positive voltage is applied to terminal PAD, a depletion layer is formed since the junction of the drain-tap 6a connected to the terminal PAD and the substrate 1 is reverse biased. If the voltage exceeds the breakdown voltage of the pnp transistor Tr.1, a junction breakdown occurs and transistor Tr.1 turns on. Since the collector current of the pnp transistor is also the base current of the horizontal npn transistor Tr.3, the horizontal transistor turns also on, thereby discharging current.

If a negative voltage is applied to the terminal PAD, a depletion layer is formed since the junction of the drain tap 6b connected to the power voltage Vdd and the substrate 1 is reverse biased. If the voltage is high enough, junction breakdown occurs and vertical pnp transistor Tr.2 turns on. Since the collector current of the pnp transistor Tr.2 is also the base current of a horizontal npn transistor Tr.4 having the n region 2a as the emitter, the substrate 1 as the base, and the n region 2b as the collector, the horizontal transistor Tr.4 turns on, thereby discharging current.

In another embodiment of the invention, all of the configuration and the operation are same as the preferred embodiment except that the doping densities fo the n+ drain tabs 6a and 6b are greater than the doping densities of the regions 4a and 4b. These higher doping densities of the n+drain tabs 6a and 6b reduce the junction breakdown voltage and further reduce the trigger voltage.

Figure 4:
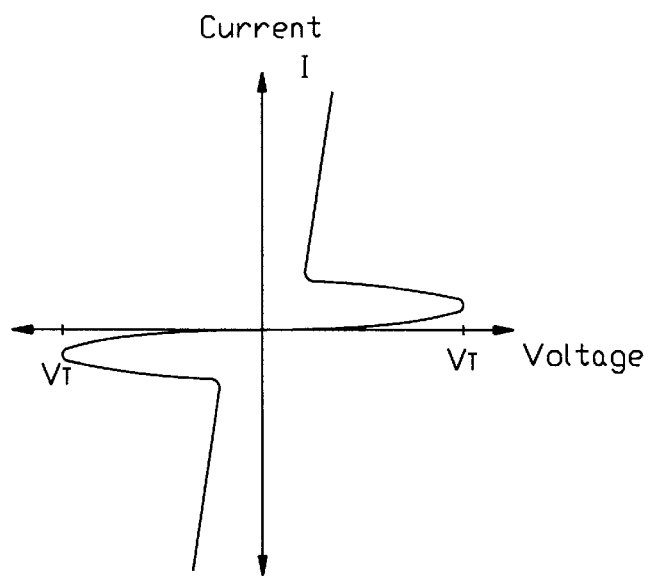
FIG. 4 is a graphical illustration showing a characteristic of an electrostatic protection device in accordance with the embodiment shown in FIG. 3.

FIG. 4 is a graphical illustration showing a characteristic of an electrostatic protection bilateral device in accordance with a preferred embodiment of the present invention. A horizontal axis indicates the voltage and a vertical axis indicates the current, and $V_T$ indicates trigger voltage of the bilateral device in accordance with the preferred embodiment of the present invention.

As described above, the protection device in accordance with the preferred embodiment of the present invention is a bilateral device, and the effect of the present invention lies in that the current can be discharged though the SCR operation for positive and negative overvoltages. A preferred embodiment of the present invention provides a protection device which discharges current due to either positive and negative overvoltages applied to the terminal PAD of a semiconductor circuit, rendering the invention particularly useful for protecting alternating current circuits.

A device according to the invention can also be characterized more broadly as including a semiconductor substrate 1 of a first conductive type having spaced apart first and second regions 4 and 5 of a second conductive type formed therein. Each region of the second conductive type includes a first region 4 of a third conductive type and a first region 4 of a fourth conductive type formed therein. A drain tap 6 of a fourth conductive type is formed in each of the first and second regions 4 and 5 of the second conductive type, and extends into the substrate 1. In this device, the regions of first conductive type comprise a p-type conductor, the regions of second conductive type comprise a n-type conductor, the regions of third conductive type comprise a p+ type conductor, and the regions of fourth conductive type comprise a n+ type conductor. A gate 20 is formed on the substrate to form a MOS transistor having drain tabs 6a and 6b of a fourth conductive type as a source and a drain.

Other embodiments of the invention will be apparent to the skilled in the art from consideration of the specification and practice of the invention disclosed herein. It is intended that the specification and examples be considered as exemplary only, with the true scope and spirit of the invention being indicated by the following claims.

What is claimed is:

1. A device for protecting a semiconductor circuit, comprising:

a semiconductor substrate of a first conductive type;

a first region of a second conductive type formed in the substrate and having a first region of a third conductive type and a first region of a fourth conductive type formed therein;

a second region of the second conductive type formed in the substrate and spaced apart from the first region of the second conductive type, and having a second region of the third conductive type and a second region of the fourth conductive type formed therein;

a third region of the fourth conductive type formed in the substrate and in contact with the first region of the second conductive type;

a fourth region of the fourth conductive type formed in the substrate and in contact with the second region of the second conductive type; and a gate formed on the substrate to form a MOS transistor having the third region of the fourth conductive type and the fourth region of the fourth conductive type as a source and a drain respectively.

2. The device of claim 1, wherein the substrate comprises a p-type conductor, the regions of the second conductive type comprise of an n-type conductor, the regions of the third conductive type comprise a p+ type conductor, and the regions of the fourth conductive type comprise an n+ type conductor.

3. The device of claim 1, wherein the regions of the second conductive type, the regions of the third conductive type and the regions of the fourth conductive type are formed symmetrically with respect to the gate.

4. The device of claim 1, wherein the first and the third conductive type are p-type, and the second and the fourth conductive type are n-type.

5. The device of claim 4, wherein the first region of the third conductive type and the first region of the fourth conductive type are connected to a terminal of the semiconductor circuit, the second region of the third conductive type and the second region of the fourth conductive type are connected to a first voltage terminal, and the gate is connected to a second voltage terminal.

6. The device of claim 4, wherein the doping densities of the first, the second, the third and the fourth regions of the fourth conductive type are greater than the doping densities of the first and the second regions of the second type, and the doping densities of the first and the second regions of the third conductive type are greater than the doping density of the substrate.

7. The device of claim 4, wherein the gate is connected to a ground.

8. A device for protecting a semiconductor circuit, comprising:

a semiconductor substrate of a first conductive type;

a first second-conductive-type region formed in the substrate and having a first region of the first conductive type and a second second-conductive-type region formed therein;

a third second-conductive-type region formed in the substrate and spaced apart from the first second-conductive-type region, and having a second region of the first conductive type and a fourth second-conductive-type region formed therein;

a fifth second-conductive-type region formed in the substrate and in contact with the first second-conductive-type region; and a sixth second-conductive-type region formed in the substrate and in contact with the third second-conductive-type region, wherein the second, the fourth, the fifth and the sixth second-conductive-type regions have higher doping densities than the first and the third second-conductive-type regions and the first and the second regions of the first conductive type have higher doping densities than the substrate, and wherein the first and the third second-conductive-type regions are located between the second second-conductive-type region and the fourth second-conductive-type region and the second region of the first conductive type, respectively.

9. The device of claim 8, further comprising a gate formed on the substrate to form a MOS transistor having the fifth and the sixth second-conductive-type regions as a source and a drain, respectively.

10. The device of claim 9, wherein the gate is connected to a ground.

11. The device of claim 9, wherein the second second-conductive-type region and the first region of the first conductive type are connected to a terminal of the semiconductor circuit, the fourth second-conductive-type region and the second region of the first conductive type are connected to a first voltage terminal, and the gate is connected to a second voltage terminal.

12. The device of claim 8, wherein the first conductive type is p-type and the second conductive type is n-type.

* * * * *